US006523252B1

(12) United States Patent
Lipponen

(10) Patent No.: US 6,523,252 B1
(45) Date of Patent: *Feb. 25, 2003

(54) COAXIAL CABLE, METHOD FOR MANUFACTURING A COAXIAL CABLE, AND WIRELESS COMMUNICATION DEVICE

(75) Inventor: Markku Lipponen, Tampere (FI)

(73) Assignee: Nokia Mobile Phones Limited, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/176,679

(22) Filed: Oct. 21, 1998

(30) Foreign Application Priority Data

Oct. 22, 1997 (FI) .................................... 974022

(51) Int. Cl.$^7$ ............................................. H04B 13/20
(52) U.S. Cl. ......................... 29/828; 29/830; 29/850; 174/251; 174/262; 174/263; 174/264; 174/265
(58) Field of Search ................... 174/251, 262, 174/263, 264, 265; 333/246, 247; 29/850, 828, 830

(56) References Cited

U.S. PATENT DOCUMENTS

| 3,613,230 A | | 10/1971 | Griff .......................... 29/624 R |
| 3,649,274 A | * | 3/1972 | Older et al. |
| 3,922,479 A | * | 11/1975 | Older et al. |
| 4,673,904 A | | 6/1987 | Landis ........................ 333/238 |
| 4,845,311 A | | 7/1989 | Schreiber et al. ............. 174/36 |
| 4,915,983 A | * | 4/1990 | Lake et al. |
| 5,828,555 A | * | 10/1998 | Itoh ............................ 361/748 |
| 5,830,301 A | * | 11/1998 | Sturzebecher et al. ... 156/89.16 |

FOREIGN PATENT DOCUMENTS

| EP | 0 288 767 A2 | | 11/1988 |
| EP | 0604 952 A1 | | 7/1994 |
| JP | 09-191206 | * | 7/1997 |
| SE | 462 194 | | 5/1990 |
| WO | WO 90/01222 | | 2/1990 |

* cited by examiner

Primary Examiner—Carl J. Arbes
(74) Attorney, Agent, or Firm—Perman & Green, LLP

(57) ABSTRACT

The invention relates to a coaxial conductor having an inner conductor (S), an outer conductor (U) encasing the inner conductor (S) at least partly, and a dielectric (E) placed between the two. The coaxial conductor (K) is formed in a multi-layer circuit board (M) primarily by means of vias (2a–2h) and strip conductors (1a–1i). According to an embodiment of the coaxial conductor of the invention, the inner conductor (S) is formed substantially parallel to the board layers (3a–3e) of the multi-layer circuit board (M), the inner conductor (S) is formed of at least one strip conductor (1a, 1b) or at least one electroconductive via (2a) or a combination of the same, and the outer conductor (U) is formed of at least four electroconductive vias (2b–2h) and at least two strip conductors (1c–1i). The dielectric (E) is at least partly formed of the material of the board layers (3a–3e). The invention relates also to a method for manufacturing this coaxial conductor. The invention relates further to a wireless communication device having at least one multi-layer circuit board (M) and at least one of these coaxial conductors.

4 Claims, 6 Drawing Sheets

Figure 1A:
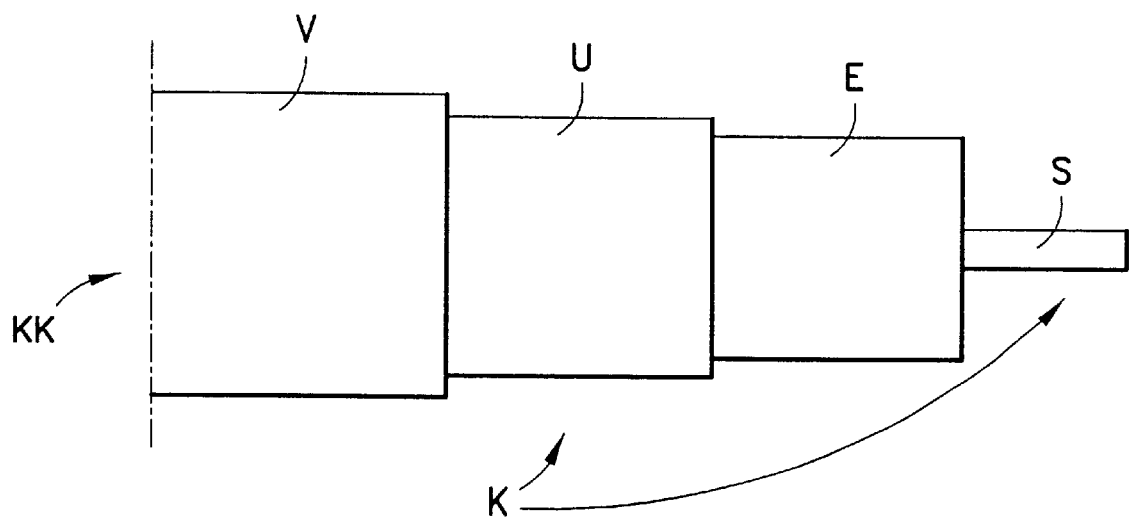

COAXIAL CABLE, METHOD FOR MANUFACTURING A COAXIAL CABLE, AND WIRELESS COMMUNICATION DEVICE

The present invention relates to a multi-layer circuit board which comprises at least a first board layer comprising a lower surface and an upper surface, and at least a second board layer comprising a lower surface and an upper surface, and said multi-layer circuit board embedding a coaxial conductor comprising an inner conductor, an outer conductor enclosing the inner conductor at least partly, as well as a dielectric placed between said inner conductor and outer conductor.

The selection of various transmission lines for different uses for transferring electric signals from one place to another depends on the properties of the transmission lines, such as attenuation caused by the conductors, frequency band of the signal to be transferred, power capacity and size of the conductors. Compared with other known transmission lines, coaxial conductors have the advantage that they are suitable for broadband radio-frequency signals, even microwave-frequency signals. Other transmission lines include a dielectrically isolated wire, a twin wire, and a conductor comprising several twin wires. A special advantage of a coaxial conductor is excellent interference suppression properties due to its structure. Thus, electromagnetic fields outside the coaxial conductor disturb the signals to be transferred in the coaxial conductor less than in other transmission lines, in which such fields induce interfering signals.

According to prior art, wireless communication devices, such as mobile phones, use a coaxial conductor formed of a coaxial conductor for the transmission of a radio-frequency signal from components placed on a circuit board, such as integrated circuits (IC), to an antenna. A coaxial cable can be used also for the transmission of sensitive signals, such as audio signals, on a circuit board from one place to another. A requirement for elimination of disturbances in data transmission by wireless communication devices is also the interference shielding capacity of transmission lines and, particularly in the case of microwave-frequency signals, also the shielding of other components, such as those placed on a circuit board, from the electromagnetic field of the signal. The signal to be transferred in the transmission line can also itself induce a disturbing electromagnetic field. By using a coaxial conductor and a coaxial conductor in the transmission of the signal, it is also possible to shield other components and conductors from disturbances caused by the signal.

In a coaxial conductor, the electric circuit for transferring a signal from one place to another consists of an inner conductor and an outer conductor enclosing the inner conductor, wherein these are placed coaxially. The inner conductor is usually a wire with a circular cross-section. The outer conductor is usually cylindrical, and there is a dielectric between the inner conductor and the outer conductor. The outer conductor is usually coupled to the ground potential, and the function of the outer conductor is to provide the coaxial conductor with sufficient electromagnetic shielding, wherein the best result is achieved with a continuous and rigid tubular structure. The inner conductor and the outer conductor are made of a conductive material, usually copper. The dielectric filling the open space between the conductors functions as a mechanical support of the conductors, and it also contributes to the electric properties of the coaxial conductor, such as attenuation of the signal to be transferred. In the manufacture of coaxial cables, the outer conductor is further coated with a jacket which is usually made of a polymeric material and serves the purposes of functioning as a dielectric and protecting the coaxial conductor from mechanical wearing and environmental conditions. In coaxial cables, also twisted band layers or stranded wires are used as the outer conductor, wherein the cable can be easily bent.

Thanks to its excellent properties, the coaxial cable is widely used, but several manual work stages must be conducted when connecting the coaxial cable to a circuit board. The work stages may include soldering of the ends of the coaxial cable onto the surface or connectors of the circuit board, which will require more and more precision and time, particularly in view of the circuit boards and the components to be placed on the circuit board becoming smaller. Smaller circuit boards will also require precise placement of the coaxial cable, wherein the cable must also be bent, if necessary. However, a minimum to the radius at bend of the coaxial cable will be set by possible damage of the outer conductor, wherein the coaxial cable will emit at the damaged portion and thus cause disturbances. Small bending radii will damage also the inner conductor and the dielectric, changing the electric properties of the coaxial cable. Due to its size and large bending radii, usually about 5 to 8 times the outer diameter of the coaxial cable, coaxial cables require a large space on the circuit board.

In the manufacture of mobile phones, the different components and coaxial cables are fixed on the circuit board by means of a soldering paste, and soldering is carried out first by heating the circuit board in an oven, e.g. at 270 degrees, wherein the soldering paste melts. After this, the circuit board is cooled down, wherein the final solid soldering joints are made. A considerable disadvantage, however, is the fact that it is also possible that in the oven, the coaxial cable is wholly or partly released from the soldering paste, due to the different curling directions of the coaxial cable and the circuit board when their material is heated. Defective products increase the manufacturing costs or malfunction of the products during their use.

A known method for manufacturing a coaxial conductor on a circuit board is disclosed in the patent publication SE 462 194. The principle of the invention presented in the publication is that a long groove is cut through at least two board layers on a circuit board, particularly a multi-layer circuit board, the groove extending from a strip conductor functioning as a first ground potential to a strip conductor functioning as a second ground potential. In the next step, the groove is filled to establish a contact between the strip conductors and to build an outer conductor. After this, the circuit board is compressed in a press to make the material used in the filling to spread in the groove.

According to the publication SE 462 194, the cutting and compression of the circuit board are conducted in separate operations and phases, which, however, increases considerably the time consumed in the manufacture and thus also the costs of the circuit board. A further problem is that the precise control of the cutting depth is very difficult, because the thickness of the strip conductors can be as small as 17 micrometers. Furthermore, the cutting is complicated by the fact that the circuit board must be positioned very carefully and without clearances to avoid lateral displacement. Moreover, the thickness of different board layers can vary in different circuit boards due to manufacturing techniques, so that it is very difficult to control the cutting depth. In addition to this, one should note that when the knife mentioned in the publication is used for cutting, the circuit board is subjected to considerable forces and its damage is very probable with normal circuit board materials.

Patent publication U.S. Pat. No. 4,673,904 discloses a method for manufacturing a coaxial conductor by superimposing on a circuit board. According to the publication, the outer conductor and the inner conductor, as well as the dielectric therebetween, are formed by superimposing on a board consisting of a copper layer and a dielectric. Because of its expensiveness, the method presented is only suitable for special uses, because it is very difficult to spread, smooth and control the thickness of the dielectric material placed between the conductors and to be formed outside the coaxial conductor, which increases considerably the work stages needed in the process and the materials to be handled. The method is not suitable for use on circuit boards which comprise also other wiring, because thus said wirings and particularly the dielectric layer of the circuit board must be manufactured in the same way as the coaxial conductor itself. The result is a considerable extension in the duration of the manufacture of the circuit board. Furthermore, the way of forming the dielectric layer differs to a great extent from the conventional technique of manufacturing circuit boards.

Furthermore, it should be noted that the size of the coaxial conductor of the publication U.S. Pat. No. 4,673,904 is limited significantly by the thickness of the conductor to be superimposed and also the size of other structures of the circuit board, because the number of layers, and simultaneously also the manufacturing time, increases with the increasing size of the conductor. For this reason, the circuit board should be made thin, whereby its strength is not sufficient e.g. for supporting components and preventing buckling. Typically, circuit board layers have a thickness of 100–150 $\mu$m. Moreover, it is obvious that with an increasing number of layers and a decreasing size of the conductor, the positioning of the circuit board must be conducted particularly accurately and carefully, which increases further the manufacturing costs and time.

It is a purpose of this invention to eliminate the above-mentioned drawbacks and particularly to present a structure for a coaxial conductor and a method for manufacturing a coaxial conductor particularly on a multi-layer circuit board. The invention is based on the idea that the coaxial conductor is formed in connection with the manufacture of other wirings and vias on the circuit board, preferably simultaneously. Furthermore, the invention is based on the idea that the coaxial conductor can be formed by applying simple vias and strip conductors which are known as such. Moreover, the invention is based on the idea that the structural elements required for manufacturing the coaxial conductor are formed in different board layers of the circuit board, and that the board layers are subsequently combined to form the coaxial conductor and, at the same time, the entire circuit board.

The most significant advantage of the invention is that the coaxial conductor can be formed in the board layers of the circuit board simultaneously with other wirings. Finally, the coaxial conductor is composed when the different board layers of the multi-layer circuit board are connected e.g. by pressing to form the entire circuit board. Thus, the manufacture of the conductor requires no separate work stages, equipment or tools. For manufacturing the conductor, use is made of vias and strip conductors embedded in different layers, these being typical structures to be placed on a circuit board; consequently, the technique is inexpensive and fast. In the simplest way, the vias of the coaxial conductor can be formed by borings which are either filled in or coated. Another advantage of the invention is that by the technique of the invention, it is possible to construct large conductors, having a thick dielectric layer, in a fast and simple way.

A remarkable advantage of the coaxial conductor of the invention is that it can be integrated on a multi-layer circuit board, wherein the coaxial conductor can be manufactured in connection with the manufacture of other conductor patterns of the circuit board. Thus, it is possible to avoid a separate installation of the coaxial conductor on the circuit board. Because the coaxial conductor can be integrated in the multi-layer circuit board, space is simultaneously released for components to be installed on the surface of the circuit board. By means of the invention, it is possible to eliminate problems arising e.g. in the manufacture of mobile phones, and the reliability of the products is improved. By means of the invention, the coupling of the coaxial conductor and the conductor patterns placed between the board layers of the multi-layer circuit board to each other will be very simple, wherein the number of solderings required can be reduced. A remarkable advantage is also the fact that changes in the direction of the coaxial conductor of the invention can be made without limits set by bending radii. Further, branching of the coaxial conductor can be implemented in a very simple manner, avoiding the need for separate connectors and manual work stages. As a result, the manufacturing costs of a device comprising a coaxial conductor according to the invention are reduced in comparison with those of prior art.

Figure 1B:
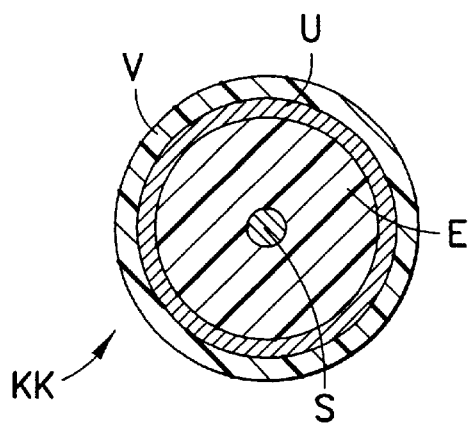
Figure 2:
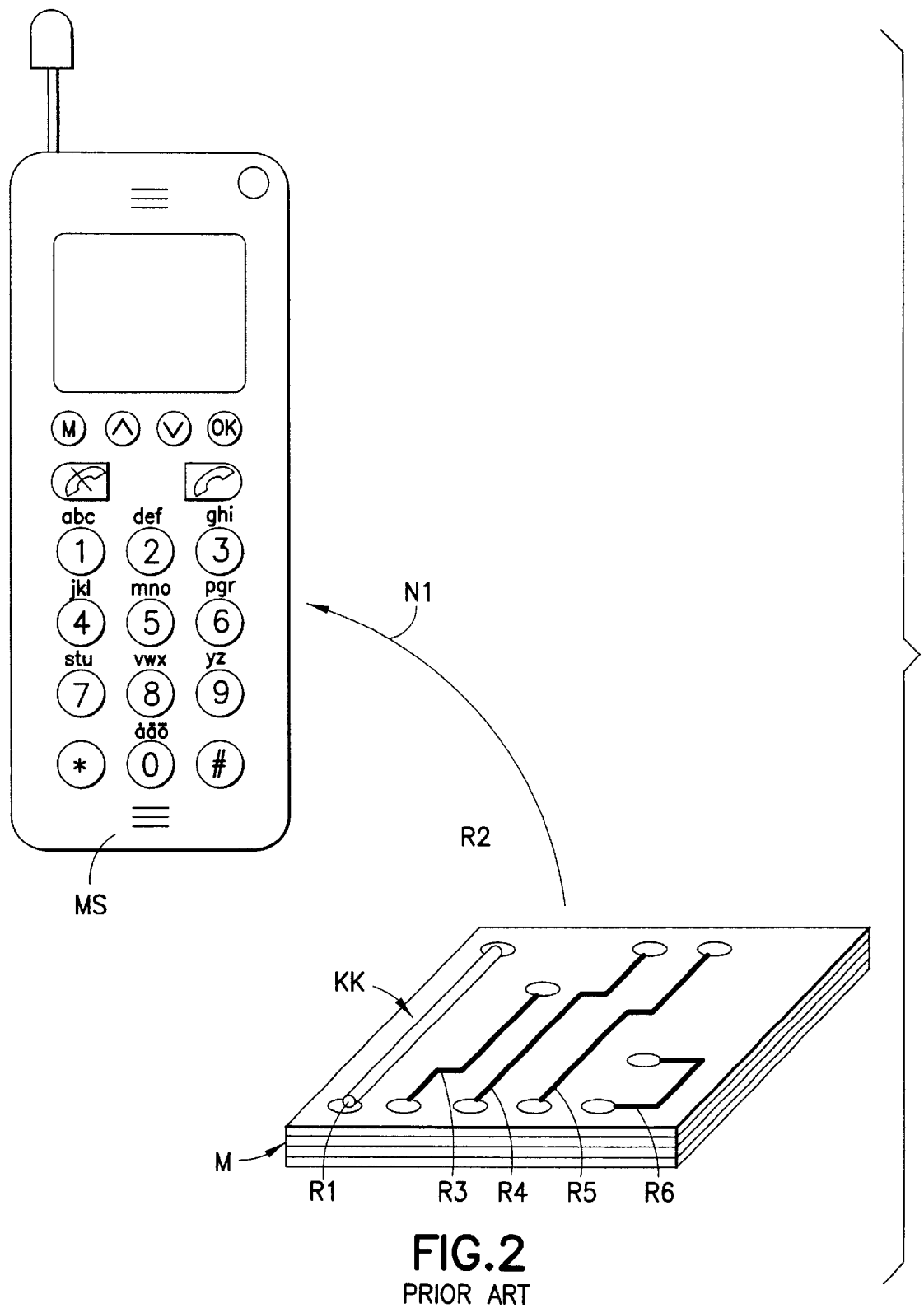
Figure 3:
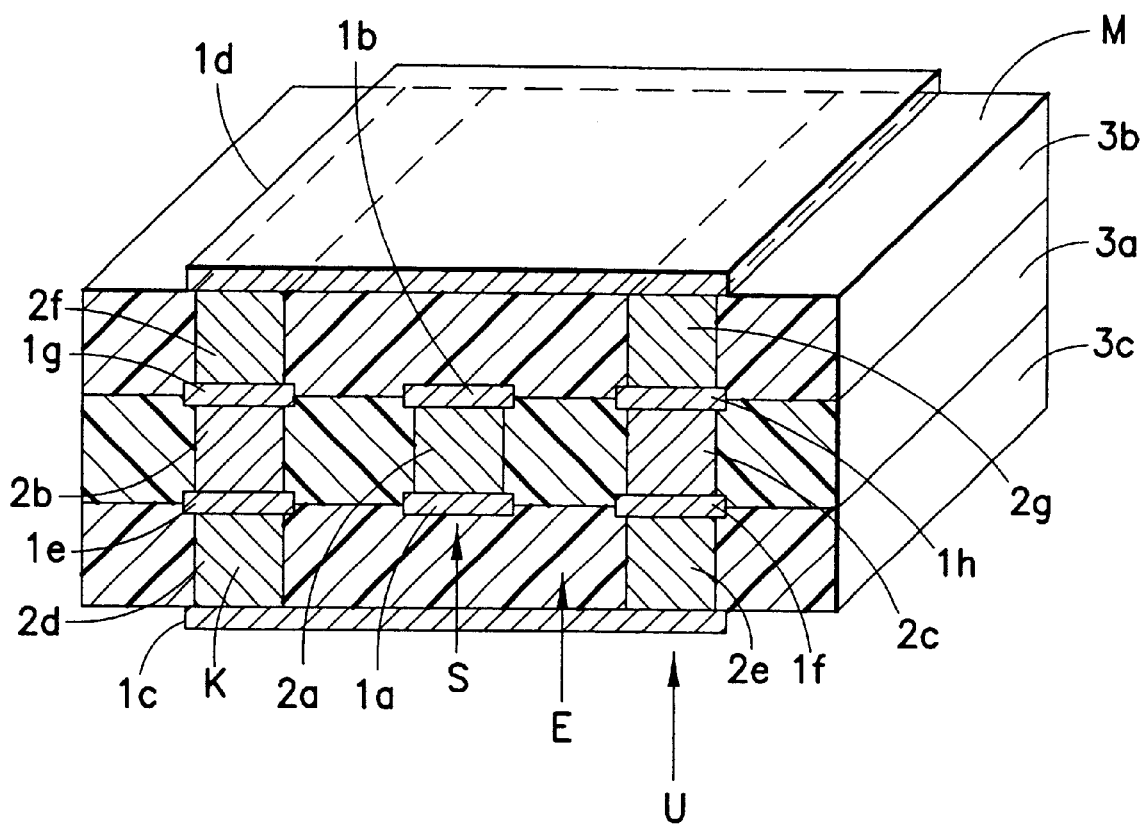
Figure 4:
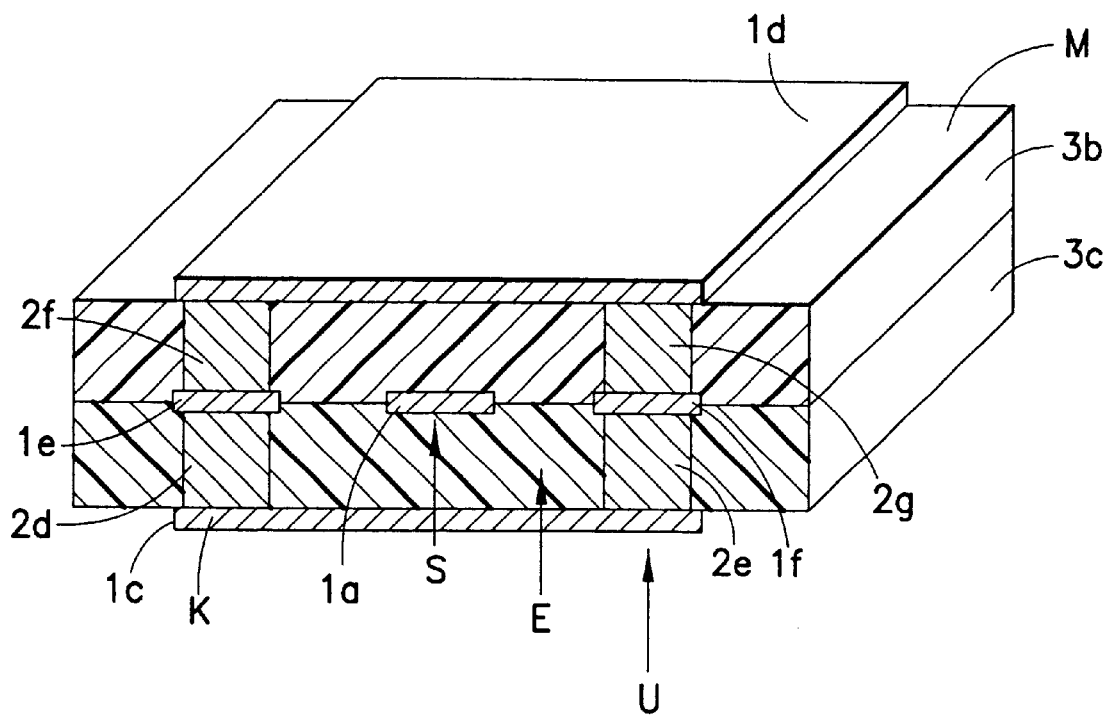
Figure 6:
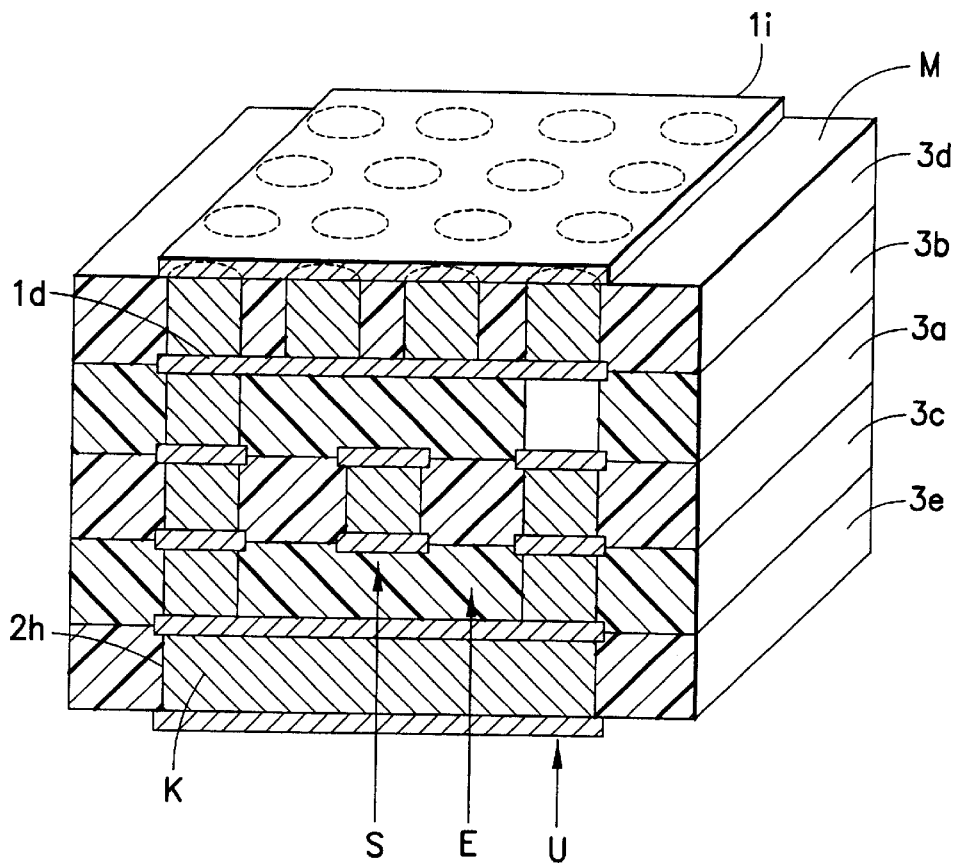
Figure 7:
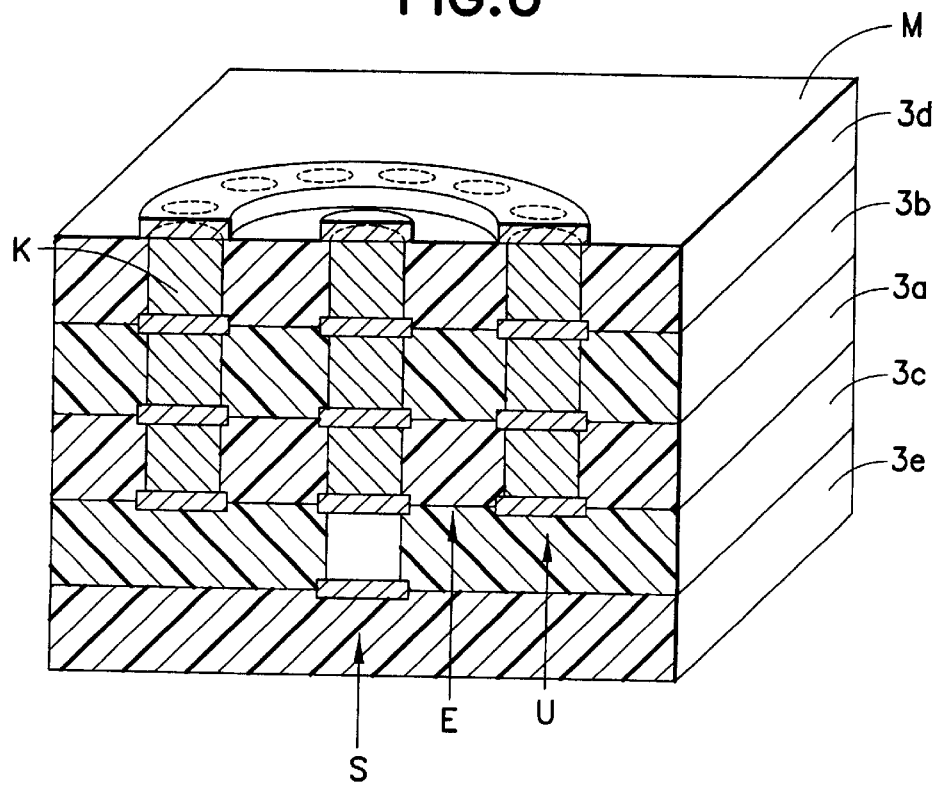
Figure 8:
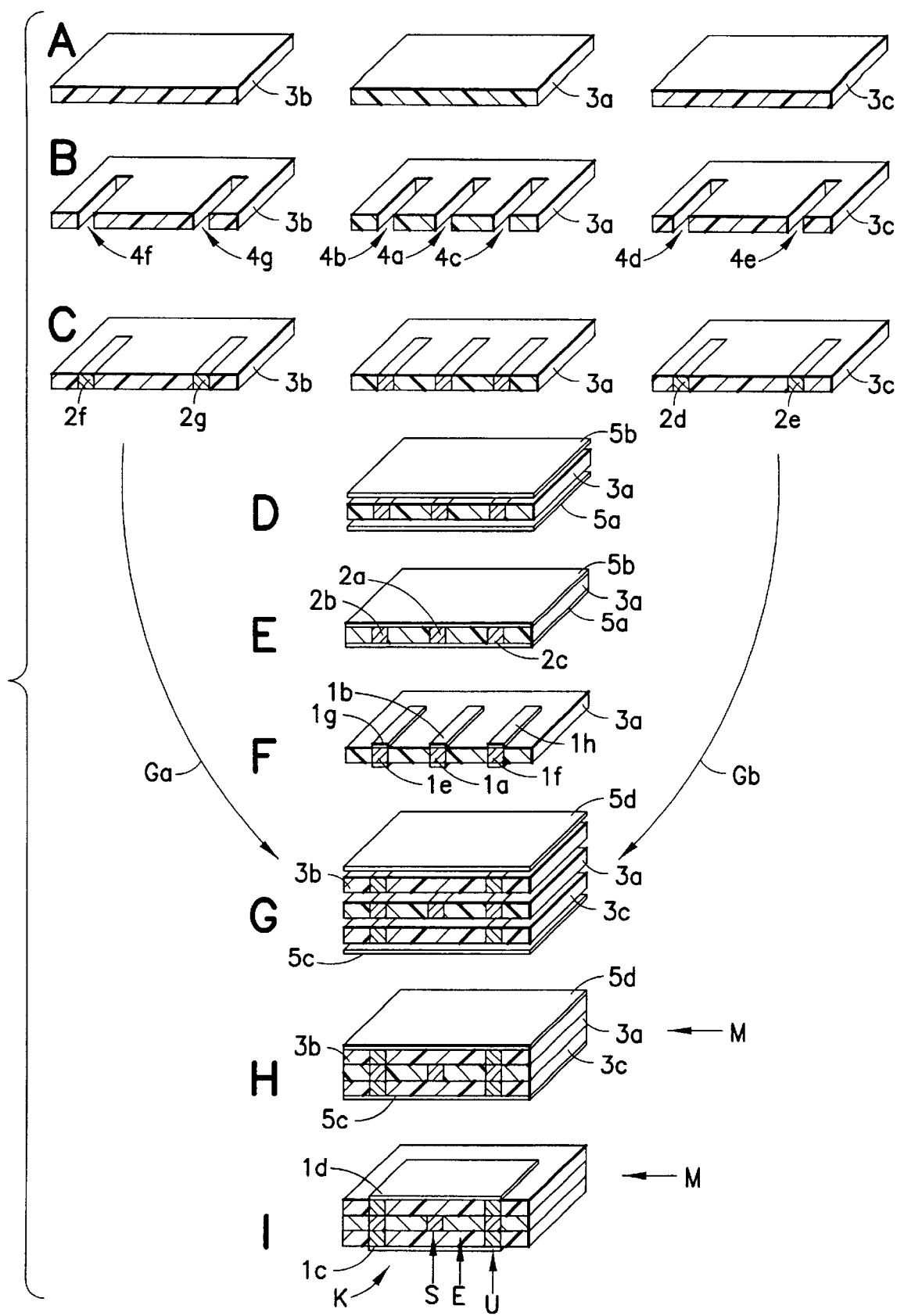

In the following, the invention will be described in more detail with reference to the appended drawings, in which FIG. 1a shows a coaxial conductor of prior art, partly cut open and seen from the side, FIG. 1b shows a coaxial conductor of prior art seen from the end, FIG. 2 shows a wireless communication device of prior art seen from above and a detail of the placement of a coaxial conductor of prior art in connection with a circuit board, in an axonometric view, FIG. 3 shows an advantageous embodiment of the coaxial conductor of the invention in an axonometric view, FIGS. 4 to 7 show other embodiments of the coaxial conductor of the invention in axonometric views, and FIG. 8 shows an advantageous embodiment of the method of the invention in a schematic view.

With reference to FIGS. 1a and 1b, a coaxial conductor KK of prior art comprises a coaxial conductor K consisting of an inner conductor S which is a wire with a usually circular cross-section, and an outer conductor U. The outer conductor U, which is usually cylindrical and has a circular cross-section, is placed to enclose the inner conductor S substantially coaxially with the same. Between the inner conductor S and the outer conductor U, there is a dielectric E. With reference to FIG. 1a, the coaxial conductor KK is shown with the nested layers exposed for clarity. The inner conductor S and the outer conductor U are made of a conductive material, usually copper. The dielectric E filling the space between the inner conductor S and the outer conductor U acts as a mechanical support for the coaxial conductor K and affects also the electric properties of the coaxial conductor K. A very common material for the dielectric E is poly(tetrafluoroethylene), i.e., PTFE plastic which can be used within a wide range of temperature. When manufacturing coaxial conductors KK, the outer conductor U is still coated with a jacket V made of a plastic material, usually poly(vinyl chloride), i.e., PVC plastic, or PE plastic, and having the purpose of protecting the coaxial conductor K from mechanical wearing and environmental conditions. In coaxial conductors KK, also twisted or stranded layers are used as the outer conductor U, made of copper wire or copper strip. Other possible materials for the outer conductor U are copper-coated aluminium and tin-coated copper wire.

FIG. 2 shows a wireless communication device according to prior art, a mobile phone MS, a multi-layer circuit board M being placed (arrow N1) in the mobile phone MS. The multi-layer circuit board M is shown in an axonometric view, and its measurements are exaggerated for clarity. By means of strip conductors, this multi-layer circuit board M is provided with conductor patterns R1–R6 for transferring signals from one place to another. These conductor patterns R1–R6 can be connected with each other by means of vias and conductor patterns placed between the board layers of the multi-layer circuit board M. It is obvious that the shape of the multi-layer circuit board M of the mobile station MS can deviate from that shown in FIG. 2, and there are usually components, such as integrated circuits (IC), placed on the multi-layer circuit board M for Implementing the functions of the mobile phone. The couplings between the components are implemented by means of the conductor patterns. As shown in FIG. 2, there is also a coaxial conductor KK placed on the multi-layer circuit board M, for the purpose of transferring the radio-frequency signal between the conductor patterns R1 and R2.

According to prior art, printed circuit boards (PCB) are used as setting-up pieces, particularly in electronics. Printed conductor patterns on PCB boards are used at least partly to replace separate wires for coupling components electrically. The material of the conductor patterns is usually copper film. A very common material for manufacturing PCB boards is glass fibre reinforced epoxide resin, and in demanding microwave-frequency applications, also glass fibre reinforced PTFE plastic is used. One alternative material for PCB boards is aramid fibre reinforced epoxide resin. According to prior art, printed boards are either single-sided, wherein the conductor patterns are placed on only one side of the PCB board, or double-sided, wherein the conductor patterns are placed on both sides of the PCB board. There are PCB boards available, with at least one side fully coated with copper e.g. by vaporizing, wherein the conductor patterns can be made by etching. For accomplishing an electric contact between conductor patterns placed on different sides, they can be connected by means of through holes made at the conductor patterns, wherein the walls of the through holes are coated with copper. Coating is usually carried out by electrolysis. The connection can also be made by means of filled-in vias, wherein the hole bored in the circuit board is filled in with a conductive copper paste. The copper paste contains e.g. copper powder, epoxy resin and a hardener. The hole is filled in by pressing by using the thick film technique known as such. The via hole can be made also by using a laser beam.

Multi-layer circuit boards may comprise two or several board layers combined or stacked (See FIG. 8) e.g. in a clamp by means of heat. Between the board layers, conductor patterns are placed, whose electrical contact with the components fixed on the PCB board is implemented by vias penetrating through one or several board layers. A via penetrating through several board layers can be made in a way that the via is made separately in each board layer and the board layers are subsequently combined, or in a way that the via is made first after combining the required board layers. In a multi-layer circuit board comprising e.g. two board layers, the layers of the conductor patterns can be placed on the bottom surface and the upper surface of the circuit board and between the two board layers.

Figure 5:
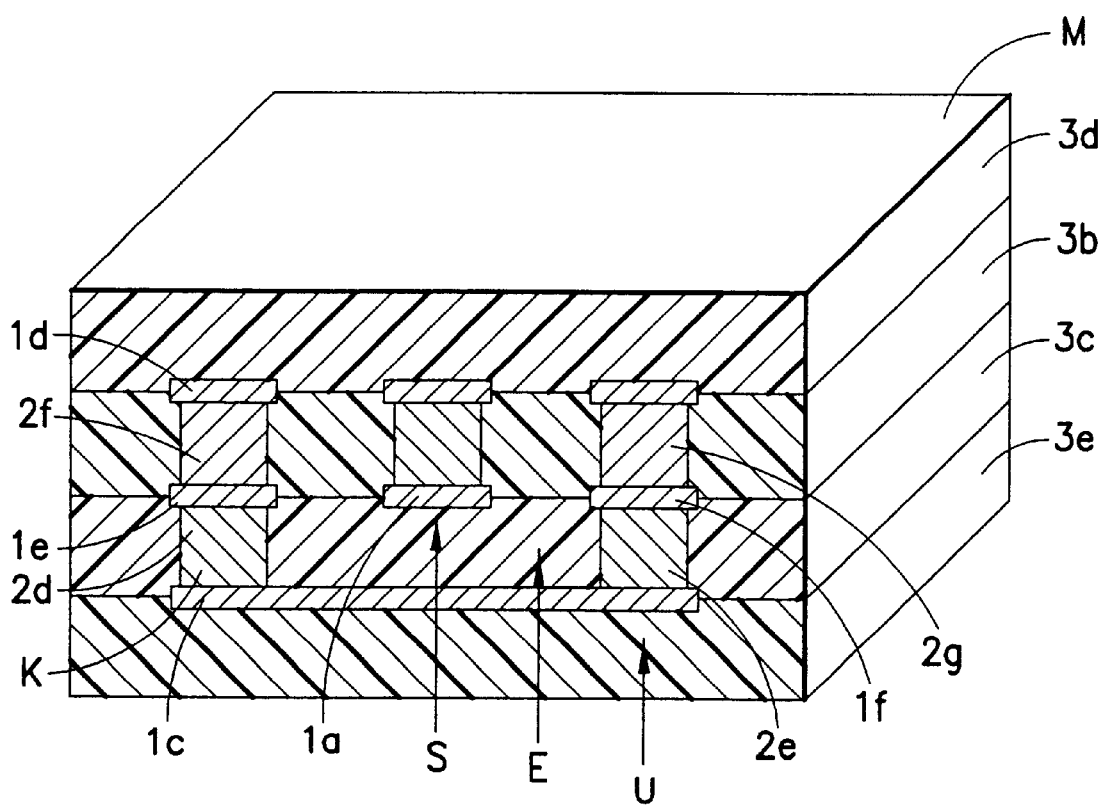

With reference to the FIGS. 3 to 7, a coaxial conductor K of the invention comprises an inner conductor S, an outer conductor U enclosing the inner conductor S, and a dielectric E placed between these. For example in FIG. 3, the coaxial conductor K according to an advantageous embodiment of the invention is formed in the multi-layer circuit board M by means of elongated, conductive vias 2a–2g and strip-like conductors 1a–1h. The coaxial conductor K is made primarily by means of the vias and the strip-like conductors, but the coaxial conductor K comprises further e.g. a dielectric E consisting of the material of the multi-layer circuit board M. A via refers in this description to a via arranged through one board layer of the multi-layer circuit board, wherein for example in FIG. 3, the outer conductor U comprises six vias 2b–2g and the multi-layer circuit board M comprises three board layers 3a–3c. The via can be cylindrical, as shown in FIG. 7, or elongated, as shown in FIG. 3. Strip-like conductors or strip conductors refer in this description also to a conductor placed between the vias, such as the four strip conductors 1e–1h of the outer conductor U in FIG. 3. For clarity, FIGS. 3 to 7 show only that part of the multi-layer circuit board M which is essential for the invention, but it is obvious that the coaxial conductor K can be made also for a larger PCB board, most advantageously in connection with manufacturing the other conductor patterns. Thus, the length of the coaxial conductor K can be substantially greater than its width, and it is obvious that the head and the tail of the coaxial conductor K can be placed in the inner part of the circuit board instead of the edge plane, as shown e.g. in FIG. 3. Similarly, it is obvious that the shape of the vias varies according to the way of manufacturing, wherein they can be e.g. conical. The vias can be hole-like or elongated filled-in or coated through holes. When making coated through holes, a strip conductor, e.g. strip conductors 1a and 1b in FIG. 3, can be made simultaneously when coating the through hole by methods known as such. Thus, it is possible that e.g. a strip conductor 1e placed between the vias 2b and 2d consists of two layers, the first of which being fixed on the lower surface of the board layer 3a and the second on the upper surface of the board layer 3c. The elongated vias can be replaced by providing the board layer with holes close to each other in a row, whereby these holes are further filled in or coated and their electrical contact is implemented by means of strip conductors. In this case, however, holes are formed in the outer conductor, through which particularly microwave-frequency inteference signals can propagate. With reference to FIGS. 3 to 7, it is also obvious that the width of each strip conductor can vary in the directions of their length and width, but they are shown having substantially equal widths for simplicity.

However, the size of the openings formed in the outer conductor can be optimized for the signal propagating in the conductor, particularly when the frequency of the signal is constant or varies within a range. Thus, with the frequency used, the size of the opening is dimensioned to differ from the size which is most advantageous in view of propagation of the signal.

With reference to FIG. 3, according to an advantageous embodiment of the coaxial conductor of the invention, the coaxial conductor K comprises strip conductors 1a–1h, wherein the strip conductors 1e and 1g are placed between the vias 2b, 2d and 2f, and wherein the strip conductors 1f and 1h are placed between the vias 2c, 2e and 2g. These strip conductors are used to secure the formation and maintenance of electric contacts of the vias placed in the different board layers 3a–3c during the manufacture of the multi-layer circuit board M and the conductor patterns. A known problem in the manufacture of vias is the fact that the holes are filled in only partly or that air-filled cavities come up in connection with filling in the holes. The inner conductor S is placed between the board layers 3b and 3c of the multi-layer circuit board M, wherein the inner conductor S is substantially parallel to the other conductor patterns of the multi-layer circuit board M. The inner conductor S consists primarily of an elongated via 2a. The inner conductor S comprises also strip conductors 1a and 1b, but it is obvious that the via 2a can solely form the inner conductor S. In another embodiment of the coaxial conductor K, with reference to FIGS. 4 and 5, the inner conductor S consists of one strip conductor 1a and the outer conductor U consists of four conductive vias 2d–2g and four strip conductors 1c–1f. Also in this embodiment, the inner conductor S is substantially parallel to the planar board layers 3b and 3c. With reference to FIG. 3, in the cross-sectional plane perpendicular to the longitudinal direction of the inner conductor S, the vias 2b–2g and the strip conductors 1c–1h constitute an advantageously closed circular outer conductor U enclosing the inner conductor S. The dielectric E consists in this case of that part of the material of the multi-layer circuit board M which is left between the outer conductor U and the inner conductor S. According to this embodiment, the dielectric E consists of three board layers 3a–3c. In case of several board layers, it is possible that the dielectric E consists partly of air-filled cavities formed by holes made in the board layers.

FIGS. 4 to 7 show other alternative embodiments of the coaxial conductor according to the invention. By means of the embodiment shown in FIGS. 3 to 7, it is possible to replace the coaxial conductor KK placed on the multi-layer circuit board M of the mobile phone MS of prior art, shown in FIG. 2, or to replace any interfering or interference sensitive normal routing of the circuit board. In comparison with the embodiment shown in FIG. 3, the board layer 3a is missing from the multi-layer circuit board M in FIG. 4. It should be noted that e.g. vias 2f and 2d on top of each other can be formed also simultaneously first after combining the board layers 3b and 3c, wherein it will not be necessary to form the strip conductor 1e. This applies also to the strip conductors 1e–1h of FIG. 3. FIG. 5 shows an embodiment in which, in comparison with the embodiment of FIG. 4, the board layers 3d and 3e are added, wherein the coaxial conductor K is left fully inside the multi-layer circuit board M. It is also possible that one of these board layers 3d and 3e is missing, wherein the broad strip conductor 1c or 1d is visible on the surface of the multi-layer circuit board M. According to the same principle, with reference to FIG. 3, it is possible to add a new board layer on the upper and lower surfaces of the multi-layer circuit board M. When the multi-layer circuit board M comprises several board layers 3b–3e as in FIG. 5, it is possible that the inner conductors S of different coaxial conductors K placed between the different board layers 3b–3e must be coupled to each other for transferring the signal. Thus, the vias can be used for coupling both the inner conductors S and the outer conductors U. Coupling the inner conductor S to the conductor pattern made on the multi-layer circuit board M is carried out easily with the strip conductor 1a connected with the inner conductor S by extending it over the end plane of the coaxial conductor K and by using vias, if necessary. With reference to FIG. 6, the portion of the outer conductor U placed in the board layer 3d is formed by several vias placed next to each other, their electrical contact being secured with wide strip conductors 1d and 1i. Further, the portion of the outer conductor U placed in the board layer 3e is formed by means of one wide elongated via 2h. As shown in FIG. 7, by arranging the vias of the outer conductor U placed in different board layers in a circular form and forming their electrical contact with strip conductors, a coaxial conductor K with its inner conductor S is accomplished, extending substantially perpendicular to the board layers. Thus, it is obvious that the outer conductor U can be formed of curved elongated vias or single circular vias.

An advantageous embodiment of the method of the invention for manufacturing a coaxial conductor is illustrated in FIG. 8. It shows the manufacture of a coaxial conductor K of FIG. 3 in a schematic view. For clarity, in steps A to I of FIG. 8, the multi-layer circuit board M and the different board layers 3a–3c are shown only in those parts that are essential for the invention. Similarly, it is obvious that the relative dimensions of the strip conductors and the vias can deviate from those shown. According to step A of FIG. 8, the manufacture of the multi-layer circuit board M is started with the board layers 3a–3c. In the next step B, the board layers 3a–3c are provided with elongated grooves 4a–4g, for example by engraving, milling, or cutting with a laser beam, for making the vias 2a–2g. When adjacent grooves, such as the elongated grooves 4a and 4b in FIG. 8, are very long, elongated tongues are formed in the board layer which may be supported by means of bridge structures, if necessary. These bridge structures are formed e.g. in a way that a single long groove is replaced by two shorter successive grooves. However, the result will be that an opening is formed in the outer conductor U of the coaxial conductor K. In the next step C, the elongated grooves 4a–1g are filled in with a conductive copper paste, to make conductive vias 2a–2g. In the next step D, copper films 5a and 5b are placed on both sides of the board layer 3a and fixed to the board layer 3a either by vaporizing or e.g. by pressing. At the same time, an electric contact is formed between the copper films 5a and 5b fixed on the surfaces of the board layer 3a as well as the conductive vias 2a–2c made in the elongated grooves 4a–kg, as shown in step E.

The conductor patterns, such as strip-like conductors, are made in the copper films 5a and 5b by methods known as such. In the following, one such method will be described, wherein e.g. the copper film 5a is coated with a substance sensitive to ultraviolet (UV) light, i.e. a photoresist. After this, the photoresist layer is exposed to UV light through a mask layer. On the exposed areas of the photoresist, a photochemical change takes place, leaving a copy of the conductor pattern of the mask layer in the photoresist. The exposed photoresist layer is developed chemically, wherein the photoresist will be removed from areas other than the exposed areas. Next, the board layer 3a is immersed in a corrosive bath, so that the copper film 5a of the board layer 3a is dissolved in the bath from other areas than those covered by the photoresist layer. Finally, the photoresist is removed from the surface of the board layer 3a e.g. by a solvent. The result is a board layer 3a according to step F, provided with the strip conductors 1a, 1b and the via 2a for forming the inner conductor S, as well as the strip conductors 1e–1h and the vias 2b, 2c for forming the outer conductor U. The strip conductors 1a, 1b and 1e–1h are necessary particularly when conductor patterns are formed on the upper and lower surfaces of the board layer 3a. At the same time, these strip conductors formed at this step protect the vias 2a–2c during the etching. In the next step G, the board layer 3a of step F, the board layers 3b and 3c of step C (arrows Ga and Gb), and copper films 5c and 5d are combined or stacked, wherein combining in a clamp will result in a multi-layer circuit board M formed of board layers 3a–3c according to step H. The copper films 5c and 5d of the multi-layer circuit board M can be treated with a photoresist, exposed and etched in the way presented above, whereby it is possible to form also other conductor patterns on the surface of the multi-layer circuit board M in connection with the strip conductors 1c and 1d of step I. Conductor patterns can be formed between the board layers 3a–3c at step E. In connection with manufacturing the coaxial conductor K, also the required conductor patterns are formed e.g. for coupling the inner conductor S to other conductor patterns and thus for transferring the signal.

An advantageous embodiment of the method of the invention as described above can also be applied in forming other coaxial conductors K shown in FIGS. 4 to 7, within the scope of the claims. The required steps will be, however, obvious for a man skilled in the art on the basis of the above description, wherein its detailed description will be unnecessary in this context. It is also obvious that the number of board layers is not limited to the five board layers 3a–3e shown in FIG. 6. Similarly, it is possible that the inner conductor S comprises vias extending to at least two board layers also when the inner conductor S is parallel to the board layers. Further, in case of several board layers, the cross-section of the outer conductor U of the coaxial conductor K can be formed more circular than that shown in FIGS. 3 to 6, wherein the conductive vias placed on top of each other in different board layers are arranged in stepwise positions in relation to each other.

It will be appreciated by a man skilled in the art that the invention is not limited solely to the embodiments presented above but it can be modified within the scope of the claims.

I claim:

1. A method for forming a multi-layer circuit board having a coaxial conductor embedded therein, the multi-layer circuit board comprising at least a first board layer with a lower surface and an upper surface, and at least a second board layer with a lower surface and an upper surface, and at least a second board layer with a lower surface and an upper surface, said coaxial conductor comprising an inner conductor, an outer conductor enclosing the inner conductor at least partly, and a dielectric placed between said inner conductor and outer conductor, said method comprising the steps of:

separately depositing a first via and a second via into corresponding grooves of the first board layer, the second via being disposed at a distance from the first via, the first and second vias forming part of said outer conductor, and said first board layer forms part of said dielectric between said first and second vias;

separately depositing a third via and a fourth via into corresponding grooves of the second board layer, the fourth via being disposed at a distance from the third via, the third and fourth vias forming part of said outer conductor, and said second board layer forms part of said dielectric between said third and fourth vias;

embedding a first strip conductor on the lower surface of said first board layer, between said first and second vias, or on the upper surface of said second board layer, between said third and fourth vias, to form said inner conductor, embedding a second strip conductor on the upper surface of said first board layer, to form part of sail outer conductor, wherein an electric coupling is formed by means of said second strip conductor between said first and second vias, embedding a third strip conductor on the lower surface of said second board layer, to form part of said outer conductor, wherein an electric coupling is formed by means of said third strip conductor between said third and fourth vias, and stacking said separate first and second board layers together in a way that said first via and third via have and electric contact to each other, that said second via and fourth via have an electric contact to each other, and that said first strip conductor is left between said first and second board layers.

2. A method according to claim 1, wherein depositing the first and second vias comprises filing the corresponding grooves in the first board layer with the first and second vias, and wherein depositing the third and fourth vias comprises filing the corresponding grooves in the second board layer with the third and fourth vias.

3. A method for forming a multi-layer circuit board having a coaxial conductor embedded therein, the multi-layer circuit board comprising at least a first board layer with a lower surface and an upper surface, and at least a second board layer with a lower surface and an upper surface, and at least a third board layer with a lower surface and an upper surface, said coaxial conductor comprising an inner conductor, an outer conductor enclosing the inner conductor at least partly, and a dielectric placed between said inner conductor and outer conductor, said method comprising the steps of:

separately depositing a first via, and a second via into corresponding grooves of the first board layer, the second via being at a distance from the first via, the first and second vias forming part of said outer conductor, wherein said first board layer forms part of said dielectric between said first and second vias, separately depositing a third via, and a fourth via into corresponding grooves of the second board layer, the fourth via being at a distance from the third via, the third and fourth vias forming part of said outer conductor, and depositing a fifth via between said third and fourth vias to form said inner conductor, wherein said second board layer forms part of said dielectric between said third and fifth vias as well as between said fifth and fourth vias, separately depositing a sixth via, and a seventh via into corresponding grooves of the third board layer, the seventh via being at a distance from the sixth via, the sixth and seventh vias forming part of said outer conductor, wherein said third layer forms part of said dielectric between said sixth and seventh vias, embedding a first strip conductor on the upper surface of said first board layer, to form said outer conductor, wherein an electric coupling is formed by means of said first strip conductor between said first and second vias, embedding a second strip conductor on the lower surface of said third board layer, to form part of said outer conductor, wherein an electric coupling is formed by means of said second strip conductor between said sixth and seventh vias, and stacking said separate first, second, and third board layers together in a way that said first, third and sixth vias have been electric contact to each other, that said second, fourth and seventh vias have an electric contact to each other, and that said fifth via is left between said first and third board layers.

4. A method according to claim 3, wherein depositing the first and second vias comprises filing the corresponding grooves in the first board layer with the first and second vias, wherein depositing the third, fourth and fifth vias comprises filing the corresponding grooves in the second board layer with the third, fourth and fifth vias, and wherein depositing the sixth and seventh vias comprises filing the corresponding grooves in the third board layer with the sixth and seventh vias.

* * * * *